(12) United States Patent
Woodruff et al.

(10) Patent No.: US 6,855,618 B2
(45) Date of Patent: *Feb. 15, 2005

(54) RADIATION HARDENED SEMICONDUCTOR DEVICE

(75) Inventors: Richard L. Woodruff, Fort Collins, CO (US); Scott M. Tyson, Albuquerque, NM (US); John T. Chaffee, Colorado Springs, CO (US); David B. Kerwin, Colorado Springs, CO (US)

(73) Assignee: Aeroflex Colorado Springs, Inc., Colorado Springs, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/284,230

(22) Filed: Oct. 30, 2002

(65) Prior Publication Data

US 2004/0166648 A1 Aug. 26, 2004

Related U.S. Application Data

(62) Division of application No. 09/072,932, filed on May 5, 1998, now Pat. No. 6,511,893.

(51) Int. Cl.[7] ............................................. H01L 21/336
(52) U.S. Cl. ....................................... 438/449; 438/289
(58) Field of Search ................................ 438/289, 298, 438/301–307, 449, 450, 953

(56) References Cited

U.S. PATENT DOCUMENTS

| | | |
|---|---|---|
| 4,179,311 A | 12/1979 | Athanas |
| 4,442,591 A | 4/1984 | Haken |
| 4,728,619 A | 3/1988 | Pfiester et al. |
| 4,748,131 A | 5/1988 | Zietlow |
| 4,849,366 A | 7/1989 | Hsu et al. |
| 5,047,356 A | 9/1991 | Li et al. |
| 5,126,278 A | 6/1992 | Kodaira |
| 5,173,438 A | 12/1992 | Sandhu |
| 5,192,712 A | 3/1993 | Aronowitz et al. |
| 5,242,849 A | 9/1993 | Sato |
| 5,247,199 A | 9/1993 | Matlock |
| 5,358,890 A | 10/1994 | Sivan et al. |
| 5,429,958 A | 7/1995 | Matlock |
| 5,474,940 A | 12/1995 | Tsukamoto |
| 5,604,370 A | 2/1997 | Mehta et al. |
| 6,008,098 A | 12/1999 | Pramanick et al. |

FOREIGN PATENT DOCUMENTS

| | | |
|---|---|---|
| EP | 0 273 702 A2 | 7/1988 |
| EP | 0 313 777 A2 | 5/1989 |
| WO | WO 90/05993 | 5/1990 |

*Primary Examiner*—Matthew Smith
*Assistant Examiner*—Calvin Lee
(74) *Attorney, Agent, or Firm*—Morgan & Finnegan, L.L.P.

(57) ABSTRACT

A method for manufacturing a radiation hardened semiconductor device, having defined active region and isolation region. The isolation region containing an isolation material and active region containing a transition region between active and isolation region, sometimes denoted a bird's beak region. Wherein the transition region is implanted with germanium and boron, to prevent formation of leakage paths between active devices, or within an active device. The implanted area can be further limited to that area of the transition region that is adapted to be covered by a gate material, such as polysilicon.

19 Claims, 3 Drawing Sheets

RADIATION HARDENED SEMICONDUCTOR DEVICE

This is a divisional application of application Ser. No. 09/072,932, filed May 5, 1998, now U.S. Pat. No. 6,511,893.

TECHNICAL FIELD

This invention relates to radiation hardening of semiconductor devices and more particularly to radiation hardening of the birds beak region to prevent formation of leakage paths in high radiation environments.

BACKGROUND ART

The field of radiation hardening in semiconductor devices deals in part with the problem of electron-hole pairs generated by the passage of ionizing radiation through the semiconductor devices. Electron-hole pairs generated in the bulk silicon do not present a severe problem, as the electrons and holes recombine rapidly. Electron-hole pairs formed in silicon dioxide are more difficult to deal with because the electrons are far more mobile than the holes and may become separated from the holes, making recombination more difficult and resulting in an accumulation of net positive charge in the silicon dioxide, or other dielectric film.

The conventional process for laterally isolating semiconductor circuits uses a field oxide between the active regions. The most common method of producing this field oxide is the localized oxidation of silicon (LOCOS) process. This results in a thick oxide layer separating adjacent semiconductor devices. This thick oxide layer is extremely susceptible to trapping positive charge in an ionizing environment. This effect is cumulative and eventually results in lowering of the threshold voltage of the parasitic field oxide transistors occurring under the field oxide, so that adjacent transistors are no longer isolated from one another.

N-Channel transistors, formed in a P-Well, separated by field oxide, are particularly affected by this phenomenon. The trapped positive charge in the field oxide repels positively charged carriers (holes) and attracts negatively charged carriers (electrons) in the surface of the underlying silicon layer. This accumulation of negatively charged carriers in the P-Well adjacent to the field oxide causes inversion of the P-type silicon and creates a conductive channel or leakage path between N-doped drain and source regions of adjacent N-Channel transistors. The accumulated negative charge in the P-Well region can also create a leakage path from the source to drain of a single N-Channel transistor, thus shorting out the N-Channel transistor. Another possible leakage path occurs between a P-Well active region adjacent to an N-Well active region, especially where polysilicon is used as an interconnect between both active regions. Thus, these undesirable parasitic transistors dominate circuit behavior and the circuit can no longer function as designed.

Conventionally, the area that will be the field oxide region is implanted before growth of the field oxide with an ion dose that is calculated to suppress the operation of parasitic transistors under normal (no ionizing radiation) environments and operating conditions. The field oxide is conventionally grown by a wet thermal process, using a LOCOS process or variations thereof. With the field implant process, there is a dopant gradient extending down into the substrate, with a high concentration at the surface changing to a background bulk concentration at some depth below the surface. The nature of the bulk silicon underlying the semiconductor circuit will depend on the nature of the process used to fabricate the circuit, such as NMOS, PMOS, or CMOS processes. Through the use of this method it is not possible to obtain the doping concentrations necessary to produce radiation hardened devices with acceptable performance for radiation doses greater than about 10 to 20 krad(Si).

Another known method is described in commonly owned U.S. Pat. No. 5,037,781 which teaches a process wherein a first high quality oxide layer is deposited over the silicon substrate. This first layer acts as a diffusion barrier. A second layer of a thick heavily doped oxide, containing recombination sites for the electrons and holes, is then deposited over the first layer. A second diffusion barrier of silicon dioxide is then deposited over the thick heavily doped layer. This art requires a unique manufacturing process which is substantially different from most commercial manufacturing processes and therefore adversely impacts the cost of radiation hardened devices.

Therefore, there exists a need for a radiation hardened semiconductor device capable of functioning in an ionizing radiation environment of approximately 100 krad(Si).

Furthermore, there exists a need for producing such a radiation hardened semiconductor device through modification of existing commercial semiconductor manufacturing processes.

DISCLOSURE OF INVENTION

An object of the present invention is to produce a radiation hardened semiconductor device that can perform in an ionizing radiation environment.

A further object of the present invention is to produce a radiation hardened semiconductor device compatible with commercial manufacturing processes.

Another object of the present invention is to suppress the operation of parasitic transistors in the bird's beak region of a field oxide in a radiation environment.

According to the present invention, a radiation hardened semiconductor device is formed by modifying a conventional semiconductor manufacturing process. A LOGOS process, or variants thereof, are used in many conventional semiconductor manufacturing processes for isolating adjacent transistors in a semiconductor device. LOCOS results in a transition region formed at the edges of the active region known as a bird's beak which is particularly susceptible to the formation of parasitic transistors. According to the present invention, the bird's beak region is implanted with an implant, such as germanium, and the implant is annealed. An implant blocking layer is then applied to the active area, again exposing the bird's beak region. The bird's beak region is then implanted with a dopant such as boron. The implant blocking layer is then removed. Further processing of the semiconductor can then be performed in accordance with conventional techniques.

The present invention has the utility of producing a radiation hardened semiconductor device that can perform in a high radiation environment. The present invention has the further utility of producing radiation hardened semiconductor devices compatible with commercial manufacturing processes. The present invention also has the utility of suppressing the operation of parasitic transistors in the bird's beak region of a field oxide in a high radiation environment.

BEST MODE FOR CARRYING OUT THE INVENTION

The process steps necessary for radiation hardening a semiconductor device and those commonly known process steps necessary for illustrating the claimed invention are described herein.

Figure 1:
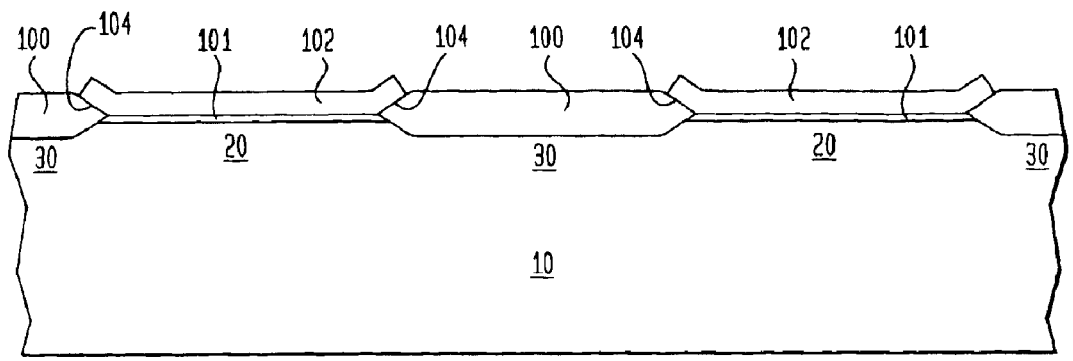
FIG. 1 illustrates a cross sectional area of a semiconductor substrate with an active area and a LOCOS field isolation in place.

Referring to FIG. 1, an N-channel insulating gate field effect transistor (IGFET) in the early stages of manufacture is illustrated. The bulk silicon 10 has been doped with a P-type dopant. This bulk silicon region may have been formed in an epitaxially grown silicon layer on a substrate that may be N-type or P-type silicon, or an epitaxial layer of silicon on an N-type or P-type bulk silicon, or an insulating substrate such as but not limited to sapphire, silicon-on-insulator (SOI), or other compatible insulating substrate. The active regions 20 are defined as are the isolation regions 30. A field oxide 100 has been formed in the isolation region 30 through a conventional LOCOS process, or variations thereof such as, but not limited to, polysilicon buffered LOCOS techniques, or recessed LOCOS techniques. The field oxide 100 has a thickness of within a range of 1,000 to 10,000 Angstroms. A masking layer 102 such as silicon nitride is located superadjacent a pad oxide 101, which is located superadjacent the active region 20. The pad oxide 101 can be either deposited or grown in accordance with known methods and has a thickness of within a range of 50 to 800 Angstroms.

During formation of the field oxide 100 a portion of the active region 20 underlying the silicon nitride is converted from silicon to silicon oxide ($Si_xO_y$). Because the molecular volume of silicon oxide is approximately twice that of the atomic volume of silicon, the silicon nitride layer 102 overlying the edges of the active region 20 is forced upward as the silicon is oxidized, forming a tapered region known as the bird's beak region 104.

The silicon nitride layer 102 is selectively removed by conventional means, such as chemical wet etch or plasma etch processes. In the preferred embodiment, the thickness of the pad oxide, used to prevent channeling during the subsequent implant, is 50 to 800 Angstroms; however, the pad oxide 101 may also be removed prior to subsequent processing.

Figure 2:
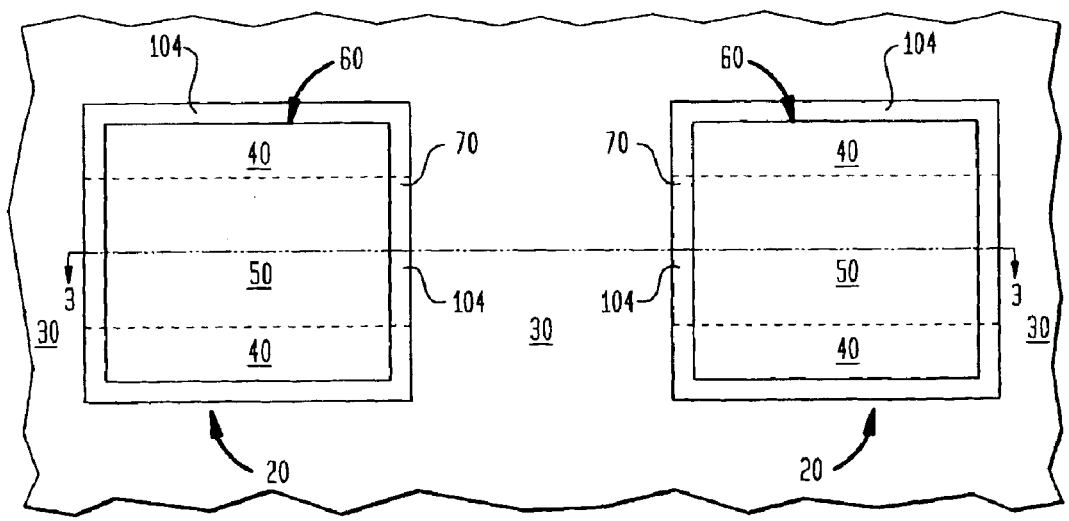
FIG. 2 illustrates a plan view of a semiconductor substrate with an implant blocking layer, according to the current invention, disposed on an upper surface thereof.

FIG. 2 illustrates the active regions 20 with an implant blocking layer 60 disposed on an upper surface thereof. N-portions 40 and P-portions 50, indicate areas of the active region 20 that will subsequently be implanted with N and P dopant respectively, for the eventual formation of an N-Channel IGFET. N-portions 40, when implanted, will become the source and drain regions, while P-portions 50 will become the channel well region. During further processing a gate layer (not shown) will be formed overlying substantially all of P-portion 50. The gate layer is comprised of a thin dielectric layer, including but not limited to silicon oxide, and a layer of overlying metallic or semiconducting material, including but not limited to polysilicon.

In the preferred embodiment, the first implant is performed without any implant barrier layer. In the preferred embodiment, first implant is germanium and is implanted at a dose within a range of $1\times10^{15}$ ions/cm$^2$ to $1\times10^{17}$ ions/cm$^2$ at an energy level of within a range 50 keV to 500 keV. The preferred species of germanium are $^{74}Ge^+$, $^{72}Ge^+$, $^{74}Ge^{++}$ and $^{72}Ge^{++}$. The preferred implant angle is within a range of 0° to 45°.

After the first implant, the pad oxide 101 and a portion of the field oxide 100 are then removed by conventional means, such as chemical wet etch or plasma etch processes. The semiconductor device 5 is then annealed at a temperature within a range of 550° C. to 1,100° C. for a time within a range of 1 minute to 100 hours, in an ambient gas including but not limited to nitrogen, argon, and/or oxygen, to incorporate the first implant into the lattice (not shown) of the semiconductor 5.

After the anneal of the first implant a screening oxide (not shown) is grown or deposited over the active region 20. The screening oxide serves to prevent channeling of the subsequent second implant; however, the subsequent second implant may be performed without formation of the screening oxide.

An implant barrier layer 60 is then applied to the upper surface of the field oxide 100 and the active area 20. In the preferred embodiment, the implant barrier layer 60 is photoresist, although any material that can be selectively etched relative to both silicon and silicon dioxide, and block the implant of the dopants to be implanted, may be used. FIG. 2 illustrates the pattern according to the first embodiment wherein the implant barrier layer 60 remains over the active area 20 while exposing the implant area 70. The implant area 70 is defined as the active portion of area 20 that comprises the bird's beak region 104 of the field oxide 100. The isolation region 30 is also exposed.

An implant of the implant area 70 and the isolation region 30 is performed using a P-type dopant such as boron. In the preferred embodiment the boron is implanted at a dose within a range of $1\times10^{11}$ ion/cm$^2$ to $5\times10^{14}$ ions/cm$^2$ at an energy level within a range 20 keV to 100 keV at an implant angle of 0 to 45° with a preferred angle of 0°. The preferred boron-containing species are $^{11}B^+$ and $BF_2^+$.

The implant barrier layer 60 is then removed by conventional means, such as an ashing process followed by a wet chemical clean. The screening oxide is then removed by conventional means, such as wet chemical etch. Further processing of the semiconductor 5 are performed in accordance with conventional techniques.

Figure 3:
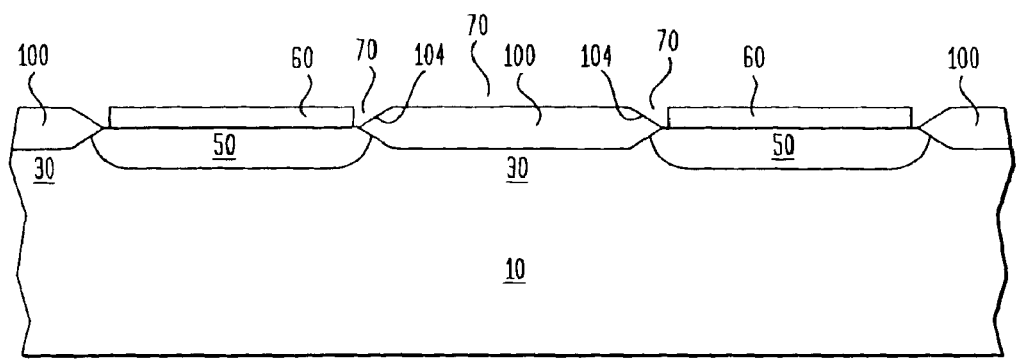
FIG. 3 illustrates a cross sectional area of the implant blocking layer taken along line 3—3 of FIG. 2.

In a second embodiment of the subject invention, the process follows the same steps as the preferred embodiment with the exception that an implant barrier 60 is applied prior to the first implant. The cross section of the implant barrier 60 is shown in FIG 3. The implant barrier 60 is removed prior to annealing the first implant.

Figure 4:
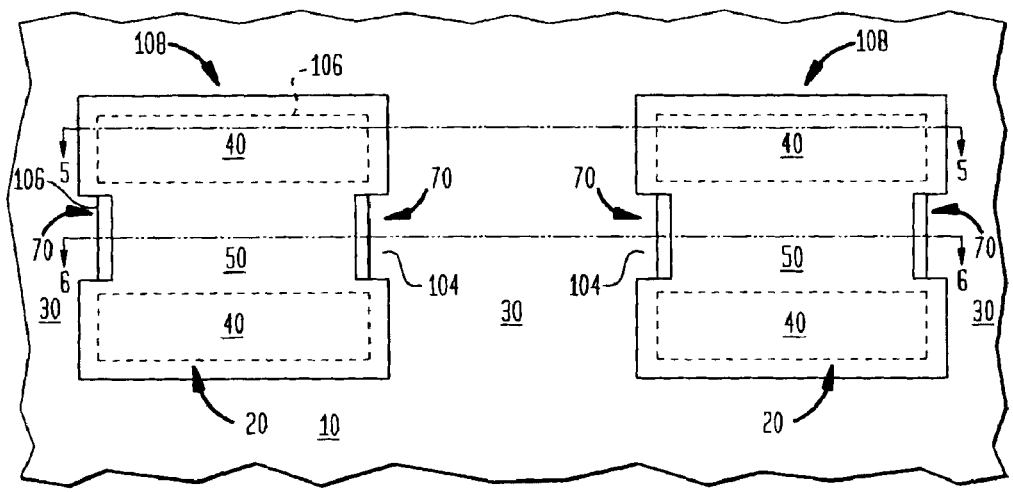
FIG. 4 illustrates a plan view of a semiconductor substrate with a second type of implant blocking layer, according to the present invention, disposed on an upper surface thereof.
Figure 5:
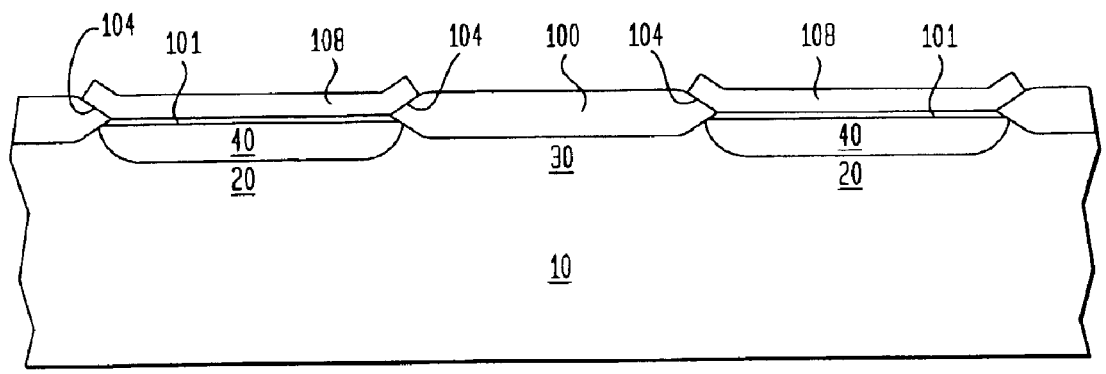
FIG. 5 illustrates a cross sectional area of the implant blocking layer taken along line 5—5 of FIG. 4.
Figure 6:
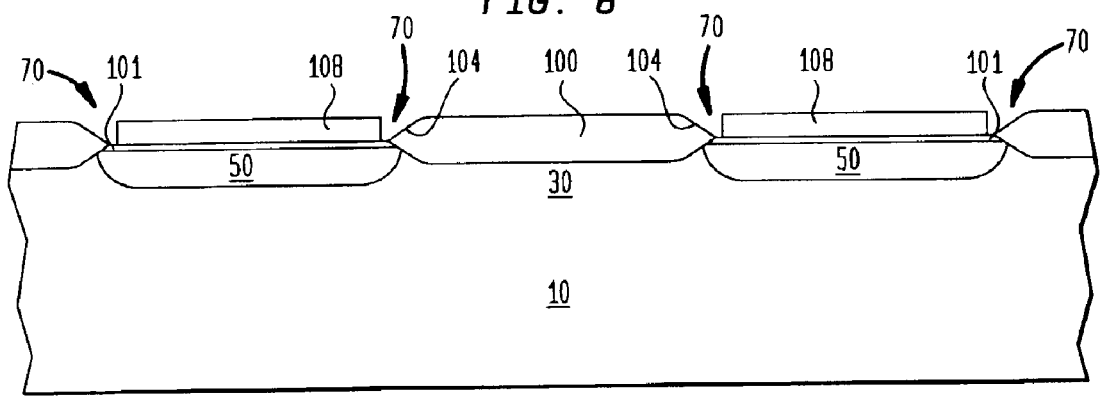
FIG. 6 illustrates a cross sectional area of the implant blocking layer taken along line 6—6 of FIG. 4.

A third and fourth embodiment of the subject invention are illustrated in FIGS. 4 through 6. The process for the third embodiment follows the same steps as the preferred embodiment with the exception that the implant barrier 108 is defined to expose a portion of the active area 20 that comprises the bird's beak region 104 that will subsequently underlie the gate layer.

The process of the fourth embodiment follows the same steps of second embodiment with the exception that the implant barrier 108 is defined to expose a portion of the active area 20 that comprises the bird's beak region 104 that will subsequently underlie the gate layer.

Figure 7:
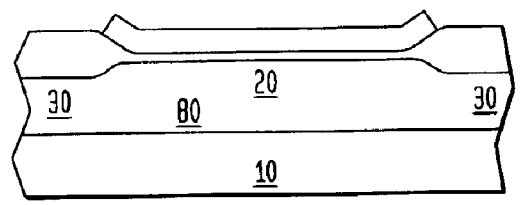
FIG. 7 illustrates a cross-sectional area of a semiconductor substrate with an active area and a LOCOS isolation in place, and a doped epitaxial layer underlying the active and isolation regions.

In a fifth embodiment of the subject invention, the process follows the same steps as the preferred embodiment with the exception that the first implant and the anneal are omitted. In this embodiment, the implant that would have been used in the first implant has been previously incorporated into an epitaxial silicon layer 80 of the substrate as shown in FIG. 7 using conventional techniques such as but not limited to molecular beam epitaxy or thermal chemical vapor deposition epitaxy. In this embodiment, the preferred implant concentration is within a range of $1\times10^{16}$ cm$^{-3}$ to $8\times10^{22}$ cm$^{-3}$. This embodiment accrues additional advantages for radiation hardness when the substrate is insulating (such as SOI wherein the insulation can be sapphire or silicon oxide), and the bottom of the field oxide abuts the insulating substrate. In this case, the parasitic transistor between adjacent IGFET's is eliminated. The parasitic bird's beak leakage path still exists, but its operation under irradiation is suppressed by the processing steps of this embodiment.

In a sixth embodiment of the subject invention, the process follows the same steps as the third embodiment with the exception that the first implant and the anneal are omitted. In this embodiment, the implant that would have been used in the first implant has been previously incorporated into an epitaxial silicon layer following the method of the fifth embodiment.

In a seventh embodiment of the subject invention, the method of the first embodiment is followed with the exception that the first implant is performed before the field oxide 100 is formed, using the LOCOS hard mask 102 as the implant barrier for said first implant. The formation of the field oxide in this embodiment is accomplished by atmospheric or high pressure thermal oxidation in an ambient containing a certain partial pressure of steam. The preferred absolute pressure is between 0.5 and 40 atmospheres, with partial pressure of steam between 0.1 and 40 atmospheres.

In an eighth embodiment of the subject invention, the method of the first embodiment is followed with the exception that a first implant is performed before the field oxide 100 is formed, using the LOCOS hard mask 102 as the implant barrier for said first implant, in addition to a second implant of the first implant that occurs after the field oxide has been formed following the method of the first embodiment. The formation of the field oxide in this embodiment is accomplished by atmospheric or high pressure thermal oxidation in an ambient containing a certain partial pressure of steam. The preferred absolute pressure is between 0.5 and 40 atmospheres, with partial pressure of steam between 0.1 and 40 atmospheres.

In a ninth embodiment of the subject invention, the method of the second embodiment is followed with the exception that the first implant is performed before the field oxide 100 is formed using the LOCOS hard mask 102 as the implant barrier for said first implant. The formation of the field oxide in this embodiment is accomplished by atmospheric or high pressure thermal oxidation in an ambient containing a certain partial pressure of steam. The preferred absolute pressure is between 0.5 and 40 atmospheres, with partial steam between 0.1 and 40 atmospheres.

In a tenth embodiment of the subject invention, the method of the second embodiment is followed with the exception that a first implant is performed before the field oxide 100 informed, using the LOCOS hard mask 102 as the implant barrier for said first implant, in addition to a second implant of the first implant that occurs after the field oxide has been formed using the implant barrier 60, following the method of the first embodiment. The formation of the field oxide in this embodiment is accomplished by atmospheric or high pressure thermal oxidation in an ambient containing a certain partial pressure of steam. The preferred absolute pressure is between 0.5 and 40 atmospheres, with partial pressure of steam between 0.1 and 40 atmospheres.

The first, second, third, fourth, seventh, eighth, ninth, and tenth embodiments can be further modified such that the anneal of the first implant is omitted. The second, third, fourth, eighth, and tenth embodiments can be further modified such that the implant barriers 60 and 108 for the first and second implants may be interchanged. The fifth and sixth embodiments can be modified by performing an implant of the first implant after the field oxide has been formed in addition to the previous incorporation of the first implant into the epitaxial layer.

It should be understood by those skilled in the art that obvious process modification can be made without departing from the spirit of the invention such as but not limited to alternate mask geometries for implant barriers and multiple implants within the same energy range as taught herein. Accordingly, reference should be made primarily to the accompanying claims, rather than the foregoing specification, to determine the scope of the subject invention.

What is claimed is:

1. A method of manufacturing a radiation hardened semiconductor device including a substrate and epitaxial layer, wherein the epitaxial layer includes germanium, the epitaxial layer including an active region and an isolation region therein, the active region including an upper surface and the isolation region including an upper surface, the active region further including a bird's beak therein, comprising:

depositing a first implant blocking layer on the upper surface of the isolation region and the upper surface of the active region;

removing a section of said first implant blocking layer to expose at least a portion of the upper surface of the isolation region and the bird's beak;

implanting the exposed portion of the isolation region and the bird's beak with a dopant; and removing said first implant blocking layer.

2. The method of claim 1 wherein the said germanium comprises at least one of $^{74}$Ge$^+$, $^{72}$Ge$^+$, $^{74}$Ge$^{++}$ and $^{72}$Ge$^{++}$.

3. The method of claim 2 wherein the dopant is implanted at a dose within a range of $1\times10^{10}$ cm$^{-2}$ to $5\times10^{14}$ cm$^{-2}$ at an energy within a range of 20 keV to 100 keV.

4. The method of claim 3 wherein the implant comprises at least one of $^{74}$Ge$^+$, $^{72}$Ge$^+$, $^{74}$Ge$^{++}$ and $^{72}$Ge$^{++}$.

5. The method of claim 4 wherein the dopant is implanted at a dose within a range of $1\times10^{11}$ cm$^{-2}$ to $5\times10^{14}$ cm$^{-2}$ at an energy within a range of 20 keV to 100 keV.

6. The method of claim 1 wherein the dopant comprises boron.

7. The method of claim 1 wherein the implant has a concentration within a range of $1\times10^{16}$ cm$^{-3}$ to $8\times10^{22}$ cm$^{-3}$.

8. The method of claim 1 wherein a pad oxide is located on the upper surface of the active region, prior to applying said first implant blocking layer, further comprising:

removing the pad oxide; and growing a screening oxide on the upper surface of the active region.

9. The method of claim 8 wherein the dopant comprises boron.

10. The method of claim 8 wherein the implant has a concentration within a range of $1 \times 10^{16}$ cm$^{-3}$ to $8 \times 10^{22}$ cm$^{-3}$.

11. The method of claim 1 wherein the substrate includes an upper surface in contact with the epitaxial layer, said upper surface comprising an insulating material.

12. The method of claim 11 wherein said insulating material comprises silicon oxide.

13. The method of claim 11 wherein said insulating material comprises sapphire.

14. The method of claim 1 wherein said section of said first implant blocking layer is removed to expose the upper surface of the isolation region and a portion of the bird's beak region, adapted to be covered by a gate layer.

15. A method of forming a radiation hardened semiconductor device including a semiconductor substrate having an upper surface, comprising:

depositing a masking layer on the upper surface;

removing a portion of said masking layer to expose an isolation region, wherein a remaining portion of said masking layer defines an active region;

implanting an upper surface of the isolation region with an implant comprising germanium;

oxidizing said isolation region to form a field oxide, wherein a portion of said implant is incorporated into said field oxide, and wherein a portion of said field oxide underlies the active region, said portion of said field oxide known as a bird's beak;

removing said remaining portion of said masking layer;

applying a first implant blocking layer on said upper surface of the isolation region and an upper surface of the active region;

removing a section of said first implant blocking layer to expose at least a portion of said upper surface of said isolation region and said bird's beak implanting said exposed portion of said isolation region and said bird's beak with a dopant; and removing said first implant blocking layer.

16. The method of claim 15, prior to applying said first implant blocking layer, further comprising implanting said isolation region and said active region with said implant.

17. The method of claim 16, prior to the step of implanting said first dopant, further comprising the steps of:

applying a second implant blocking layer to said upper surface of said isolation region and said upper surface of said active region; and removing a section of said second implant blocking layer and exposing said isolation and said bird's beak region; and removing said second implant blocking layer after the step if implanting said first dopant.

18. The method of claim 17 wherein said section of said first implant blocking layer is removed to expose said upper surface of said isolation region and a portion of said bird's beak region adapted to be covered by a gate layer and wherein said section of said second implant blocking layer is removed to expose said upper surface of said isolation region and a portion of said bird's beak region adapted to be covered by a gate layer.

19. The method of claim 15 wherein said section of said first implant blocking layer is removed to expose said upper surface of said isolation region and a portion of said bird's beak region adapted to be covered by a gate layer.

* * * * *